United States Patent [19]
Michael et al.

[11] Patent Number: 5,937,299
[45] Date of Patent: Aug. 10, 1999

[54] METHOD FOR FORMING AN IGFET WITH SILICIDE SOURCE/DRAIN CONTACTS IN CLOSE PROXIMITY TO A GATE WITH SLOPED SIDEWALLS

[75] Inventors: Mark W. Michael, Cedar Park; Robert Dawson; H. Jim Fulford, Jr., both of Austin; Mark I. Gardner, Cedar Creek; Frederick N. Hause, Austin; Bradley T. Moore, Austin; Derick J. Wristers, Austin, all of Tex.

[73] Assignee: Advanced Micro Devices, Inc., Sunnyvale, Calif.

[21] Appl. No.: 08/837,522

[22] Filed: Apr. 21, 1997

[51] Int. Cl.$^6$ .................................................. H01L 21/336
[52] U.S. Cl. ........................ 438/299; 438/300; 438/307; 438/529; 438/592
[58] Field of Search ..................... 438/299, 305, 438/585, 592, 300, 527, 529, 530, 301, 306, 307

[56] References Cited

U.S. PATENT DOCUMENTS

| | | | |
|---|---|---|---|
| 4,074,300 | 2/1978 | Sakai et al. | 438/592 |
| 4,558,338 | 12/1985 | Sakata | 148/DIG. 82 |
| 4,629,520 | 12/1986 | Ueno et al. | 438/532 |
| 4,945,070 | 7/1990 | Hsu | 438/301 |
| 4,948,745 | 8/1990 | Pfiester et al. | 438/300 |
| 5,200,352 | 4/1993 | Pfiester | 438/300 |
| 5,504,031 | 4/1996 | Hsu et al. | 438/305 |
| 5,578,838 | 11/1996 | Cho et al. | 257/66 |
| 5,683,924 | 11/1997 | Chan et al. | 438/300 |
| 5,824,587 | 10/1998 | Krivokapic | 438/300 |

*Primary Examiner*—Michael Trinh
*Attorney, Agent, or Firm*—Skjerven, Morrill, MacPherson, Franklin & Friel, L.L.P.; William W. Holloway

[57] ABSTRACT

An IGFET with source and drain contacts in close proximity to a gate with sloped sidewalls is disclosed. A method of making the IGFET includes forming a gate over a semiconductor substrate, wherein the gate includes a top surface, a bottom surface and opposing sidewalls, and the top surface has a substantially greater length than the bottom surface, forming a source and a drain that extend into the substrate, depositing a contact material over the gate, source and drain, and forming a gate contact on the gate, a source contact on the source, and a drain contact on the drain. The gate is separated from the source and drain contacts due to a retrograde slope of the gate sidewalls, and the gate contact is separated from the source and drain contacts due to a lack of step coverage in the contact material. Preferably, the contact material is a refractory metal, and the contacts are formed by converting the refractory metal into a silicide. In this manner, a highly miniaturized IGFET can be provided with densely-packed gate, source and drain contacts without the need for sidewall spacers adjacent to the gate.

20 Claims, 6 Drawing Sheets

METHOD FOR FORMING AN IGFET WITH SILICIDE SOURCE/DRAIN CONTACTS IN CLOSE PROXIMITY TO A GATE WITH SLOPED SIDEWALLS

BACKGROUND OF THE INVENTION

1. Field of the Invention

The present invention relates to integrated circuit manufacturing, and more particularly to forming insulated-gate field-effect transistors with densely-packed gate, source and drain contacts.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then the implanted dopant is activated using a high-temperature anneal that would otherwise melt the aluminum.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the sidewalls of the gate, and a heavy implant is self-aligned to spacers adjacent to the sidewalls of the gate. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics.

Since it is very important to reduce the series resistance of the gate, source and drain for submicron devices, several techniques have been developed to improve contact resistance. One such approach is to use a refractory metal silicide to contact these regions. With this approach, a thin layer of refractory metal is deposited over the structure, and then heat is applied to form a silicide wherever the refractory metal is adjacent to silicon (including single crystal silicon and polysilicon). Thereafter, an etch is applied that removes unreacted refractory metal over the spacers to prevent bridging silicide contacts for the gate, source and drain. Various suicides, including PtSi, $MoSi_2$, $CoSi_2$ and $TiSi_2$ have been used for this purpose. An advantage to this approach is that the silicide contacts for the gate, source and drain are formed simultaneously and are self-aligned by the spacers. This self-aligned silicide is sometimes referred to as "salicide."

After the silicide contacts are formed, typically an oxide layer is formed over the device, contact windows are etched in the oxide layer to expose the silicide contacts, a blanket layer of metallization is deposited over the oxide layer and into the contact windows to provide interconnect metallization, selected regions of the interconnect metallization are removed, and then a passivation layer is deposited over the substrate.

A drawback to conventional silicide contact formation is that typically the spacers are essential to prevent bridging the silicide contacts, and the spacers occupy valuable chip area. Although disposable spacers can be employed and subsequently removed, the additional chip area is still required. Another drawback is that the channel length is often limited by the minimum resolution of the photolithographic system, since a substantial overlap between the gate and the source/drain may create unwanted capacitive effects. These drawbacks tend to constrain efforts towards further miniaturizing the device.

Accordingly, a need exists for a method of fabricating an IGFET that forms densely-packed contacts for the gate, source and drain in order to provide further reductions in device size.

SUMMARY OF THE INVENTION

A primary object of the invention is to provide a highly miniaturized IGFET with densely-packed contacts for the gate, source and drain without the need for sidewall spacers. This can be accomplished by disposing contacts for the source and drain in close proximity to a gate with sloped sidewalls.

In accordance with one aspect of the invention, a method of forming an IGFET includes forming a gate over a semiconductor substrate, wherein the gate includes a top surface, a bottom surface and opposing sidewalls, and the top surface has a substantially greater length than the bottom surface, forming a source and a drain that extend into the substrate, depositing a contact material over the gate, source and drain, and forming a gate contact on the gate, a source contact on the source, and a drain contact on the drain. The gate is separated from the source and drain contacts due to a retrograde slope of the gate sidewalls, and the gate contact is separated from the source and drain contacts due to a lack of step coverage in the contact material.

In accordance with a first embodiment of the invention, the source and drain are entirely within the substrate, and the source and drain contacts are adjacent to the substrate. In accordance with a second embodiment of the invention, the source and drain include elevated source and drain regions above the substrate and on underlying source and drain regions in the substrate, and the source and drain contacts are adjacent to the elevated source and drain regions and spaced from the substrate.

Preferably, the contact material is a refractory metal, and the gate, source and drain contacts are formed by converting the refractory metal into a silicide.

A primary advantage of the invention is that a highly miniaturized IGFET can be provided with densely-packed silicide contacts for the gate, source and drain without the need for sidewall spacers adjacent to the gate. Another advantage is that the invention is well-suited for forming contacts on elevated source and drain regions. A still further advantage is that the channel length can be considerably narrower than the minimum resolution of the available photolithographic system without creating unwanted capacitive effects due to overlap between the gate and the source/drain.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
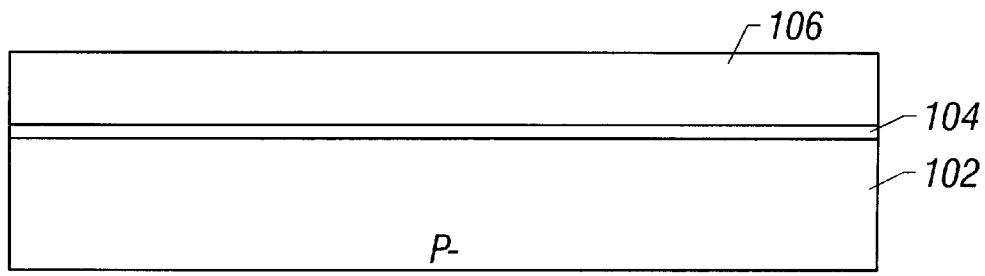
FIGS. 1A–1I show cross-sectional views of successive process steps for forming an IGFET with source and drain contacts in close proximity to a gate with sloped sidewalls in accordance with a first embodiment of the invention.

In the drawings, depicted elements are not necessarily drawn to scale and like or similar elements may be designated by the same reference numeral throughout the several views.

FIGS. 1A–1I show cross-sectional views of successive process steps for forming an IGFET with source and drain contacts in close proximity to a gate with sloped sidewalls in accordance with a first embodiment of the invention.

In FIG. 1A, silicon substrate 102 suitable for integrated circuit manufacture includes a P-type epitaxial surface layer disposed on a P+ base layer (not shown). The epitaxial surface layer provides an active region with a boron background concentration on the order of $1 \times 10^{16}$ atoms/cm$^3$, a <100> orientation and a resistivity of 12 ohm-cm. Substrate 102 can be subjected to a threshold voltage implant, a punch-through implant, and a well implant as is conventional. For convenience of illustration, dielectric isolation such as field oxides between adjacent active regions is not shown. A blanket layer of gate oxide 104, composed of silicon dioxide (SiO$_2$), is formed on the top surface of substrate 102 using tube growth at a temperature of 700 to 1000° C. in an O$_2$ containing ambient. Gate oxide 104 has a thickness in the range of 30 to 100 angstroms. Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that polysilicon 106 be initially doped after a subsequent etch when the gate is formed and source/drain implantation occurs.

Figure 1B:
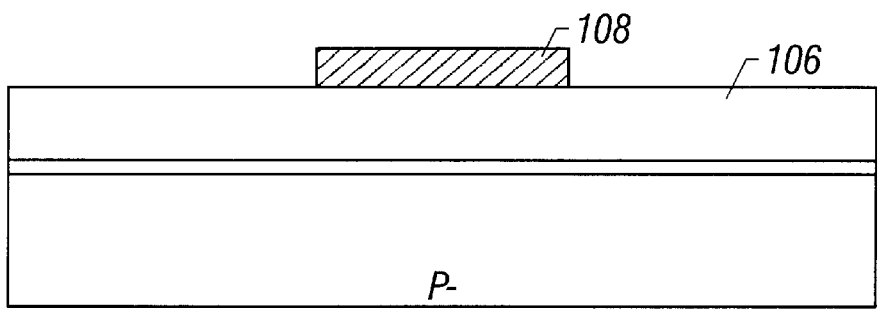

In FIG. 1B, photoresist 108 is deposited on polysilicon 106 and patterned to selectively expose polysilicon 106. Photoresist 108 is patterned using a photolithographic system, such as a step and repeat optical projection system, in which deep ultraviolet light from a mercury-vapor lamp is projected through a reticle and a focusing lens to obtain the desired image pattern. For illustration purposes, the minimum resolution of the photolithographic system is 3500 angstroms (0.35 microns). Thereafter, photoresist 108 is developed and the irradiated portions are removed, so that photoresist 108 has a length (or linewidth) of 3500 angstroms.

Figure 1C:
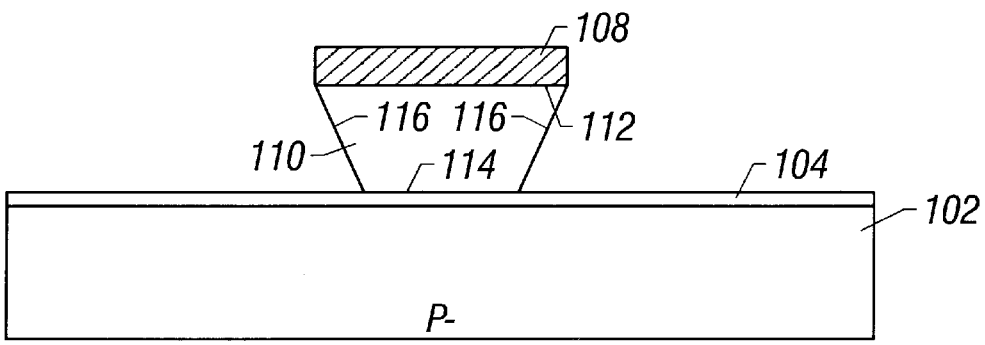

In FIG. 1C, a dry etch is applied that removes all polysilicon 106 outside photoresist 108, and also removes portions of polysilicon 106 beneath photoresist 108. The remaining (unetched) polysilicon 106 provides gate 110 with a trapezoid-like shape in which the length increases as the height increases. The dry etch is highly selective of polysilicon and non-selective of silicon dioxide so that only a negligible amount of gate oxide 104 is removed and substrate 102 is unaffected. The dry etch is also re-entrant and the lateral etch rate of polysilicon 106 increases as the depth of polysilicon 106 increases. This can be accomplished by selecting appropriate etch parameters so that as etching occurs, polymer from photoresist 108 builds up on the sidewalls of polysilicon 106 as a function of the depth of polysilicon 106. For instance, various etching profiles from the dry etching of polysilicon produced with an AZ-1350 DQN photoresist and various etchants under anisotropic and isotropic conditions are reported by Adams and Capio in "Edge Profiles in the Plasma Etching of Polycrystalline Silicon," *Journal of the Electrochemical Society*, Vol. 128, pp. 366–370 (February 1981), which is incorporated herein by reference. The etching profiles reported by Adams and Capio include substantially linear sidewalls that slope outward with increasing height.

After etching occurs, gate 110 includes planar top surface 112, planar bottom surface 114, and substantially linear opposing sidewalls 116 with a retrograde slope that slopes outward as the height of gate 110 increases. Top surface 112 has a length of 3500 angstroms, bottom surface 114 has a length of 3000 angstroms, and sidewalls 116 each extend 250 angstroms lengthwise between top surface 112 and bottom surface 114.

Figure 1D:
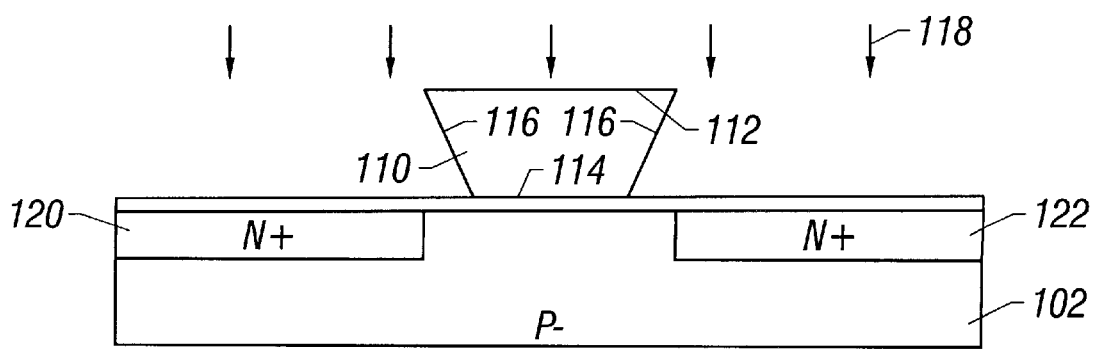

In FIG. 1D, photoresist 108 is stripped, and the structure is subjected to ion implantation of arsenic and phosphorus, as indicated by arrows 118, at a dosage in the range of $1 \times 10^{15}$ to $5 \times 10^{15}$ atoms/cm$^2$ and an energy in the range of 30 to 60 kiloelectron-volts, using gate 110 as an implant mask for the underlying region of substrate 102. As a result, heavily doped source and drain regions 120 and 122 are implanted into substrate 102 and are substantially aligned with the left and right edges of top surface 112 (which intersect sidewalls 116). Heavily doped source and drain regions 120 and 122 are doped N+ with a dopant concentration in the range of $1 \times 10^{18}$ to $1 \times 10^{20}$ atoms/cm$^3$, and are spaced from bottom surface 114 by about 250 angstroms. In addition, gate 110 becomes a heavily doped polysilicon gate.

Figure 1E:
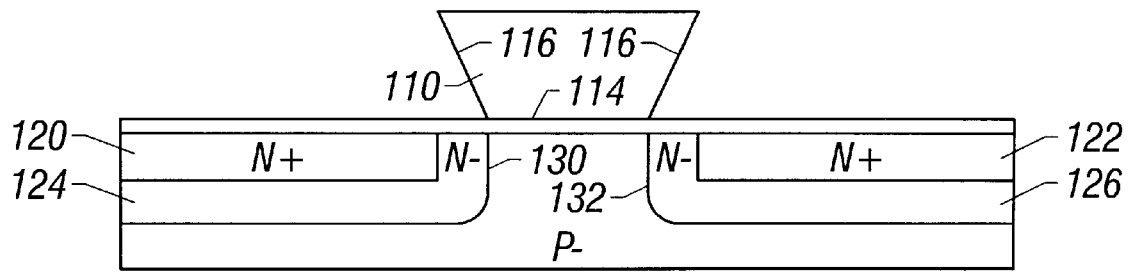

In FIG. 1E, the device is annealed to remove crystalline damage and drive-in and activate the implanted dopants using a rapid thermal anneal on the order of 950 to 1050° C. for 10 to 30 seconds.

The phosphorus diffuses far more rapidly than the arsenic. As a result, phosphorus in heavily doped source and drain regions 120 and 122 diffuses out of these regions to form lightly doped source and drain regions 124 and 126. Lightly doped source and drain regions 124 and 126 are doped N− with a dopant concentration in the range of about $1 \times 10^{17}$ to $1 \times 10^{18}$ atoms/cm$^3$. Furthermore, lightly doped source region 124 forms channel junction 130 that is substantially aligned with the left edge of bottom surface 114 (which intersects a sidewall 116), and lightly doped drain region 126 forms channel junction 132 that is substantially aligned with the right edge of bottom surface 114 (which intersects the opposing sidewall 116). Channel junctions 130 and 132 define a channel between a source, that consists of lightly and heavily doped source regions 124 and 120, and a drain, that consists of lightly and heavily doped drain regions 126 and 122, for an N-channel MOSFET controlled by gate 110.

Figure 1F:
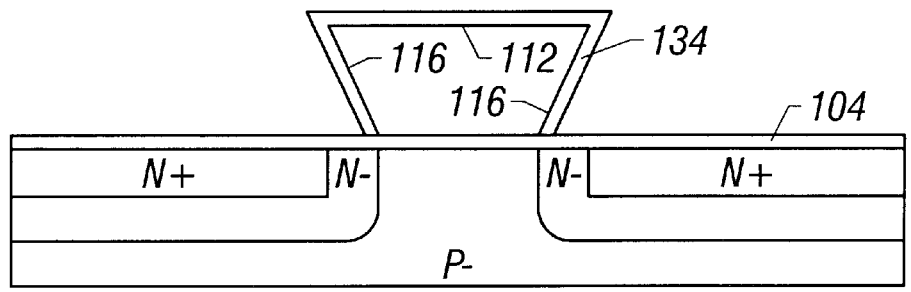

In FIG. 1F, liner oxide 134 composed of silicon dioxide is thermally grown on the exposed polysilicon surfaces, which include top surface 112 and sidewalls 116 of gate 110, using tube growth at a temperature of 700 to 1000° C. in an $O_2$ containing ambient. Liner oxide 134 provides a continuous layer with a thickness in the range of 50 to 200 angstroms. The thermal oxidation also slightly increases the thickness of the exposed gate oxide 104.

Figure 1G:
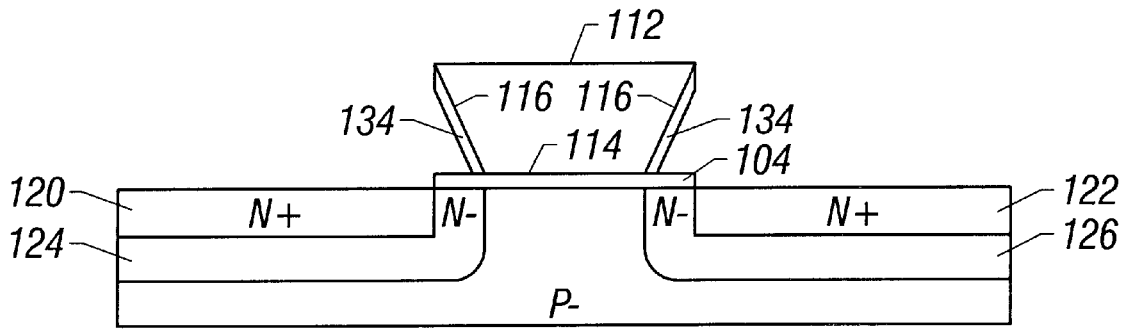

In FIG. 1G, an anisotropic reactive ion etch is applied that is highly selective of silicon dioxide with respect to polysilicon (and silicon). The etch removes the oxide regions that are not beneath top surface 112 while leaving intact the oxide regions that are beneath top surface 112. In particular, liner oxide 134 is removed from top surface 112, and gate oxide 104 is removed from heavily doped source and drain regions 120 and 122. As a result, top surface 112 and heavily doped source and drain regions 120 and 122 are exposed. However, gate oxide 104 remains on lightly doped regions 124 and 126 as well as beneath bottom surface 114, and liner oxide 134 remains on sidewalls 116.

Figure 1H:
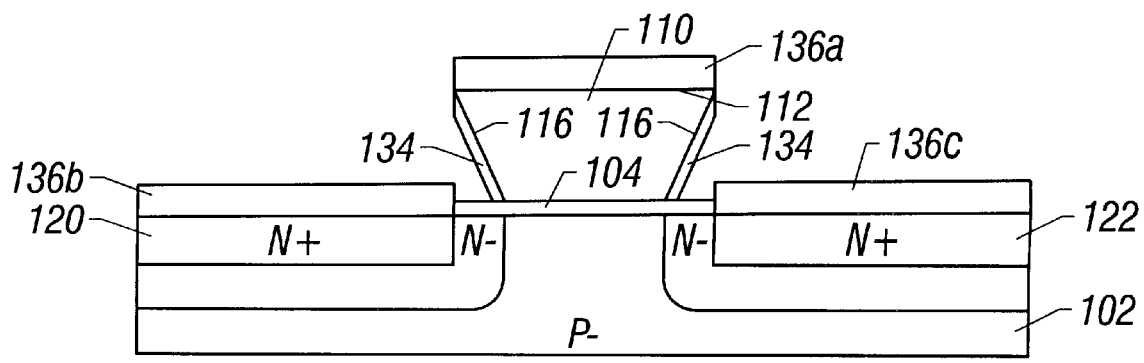

In FIG. 1H, a blanket layer of titanium 136 with a thickness in the range of 100 to 350 angstroms is deposited over substrate 102 by LPCVD at an angle normal to substrate 102. Preferably, titanium 136 is deposited directly on top surface 112 and heavily doped source and drain regions 120 and 122 without any intervening native oxide. Titanium 136 forms titanium segment 136A on gate 110, titanium segment 136B on heavily doped source region 120, and titanium segment 136C on heavily doped drain region 122. Titanium segments 136A, 136B and 136C have essentially identical compositions, essentially identical thicknesses and are formed simultaneously. Furthermore, the thickness of gate 110 (2000 angstroms) is substantially greater than the thicknesses (100 to 350 angstroms) of titanium segments 136A, 136B and 136C. As a result, the left sidewall of titanium segment 136A is substantially aligned with and above and separated from the right sidewall of titanium segment 136B, and likewise, the right sidewall of titanium segment 136A is substantially aligned with and above and separated from the left sidewall of titanium segment 136C. As is seen, titanium segments 136B and 136C are spaced from sidewalls 116 due to the retrograde slope of sidewalls 116. In addition, liner oxide 134 on sidewalls 116 assures that any portions of titanium segments 136B and 136C that might extend beneath top surface 112 remain electrically isolated from gate 110.

Of importance, titanium segment 136A is separated from titanium segments 136B and 136C due to a lack of step coverage of titanium 136, using gate 110 and gate oxide 104 as the step above substrate 102. Step coverage is a measure of how well a film maintains its nominal thickness as it crosses a step. Step coverage is expressed by the ratio of the minimum thickness of a film as it crosses a step, $t_s$, to the nominal thickness of the film on horizontal regions, $t_n$. That is, $$\text{Step coverage}(\%) = (t_s/t_n) \times 100\% \quad (1)$$

Step coverage of 100% is ideal for a conductive line, but in general the height of the step and the aspect ratio of the features being covered impact the expected step coverage. The greater the step height or aspect ratio, the more difficult it is to attain coverage of the step without a corresponding thinning of the overlying film. In addition to step height and aspect ratio, step coverage depends on the contour and slope of the step. In general, a smoother step and the less vertical its slope, the better the step coverage will be. With titanium 136 there is 0% step coverage, or stated differently, a lack of step coverage. That is, titanium segments 136A, 136B and 136C are separated segments formed simultaneously as a blanket layer of titanium 136 is deposited on gate 110 and heavily doped source and drain regions 120 and 122. Advantageously, titanium segments 136A, 136B and 136C are separated from one another without the need for spacers extending beyond top surface 112, and without the need for subsequent etching or polishing steps.

Figure 1I:
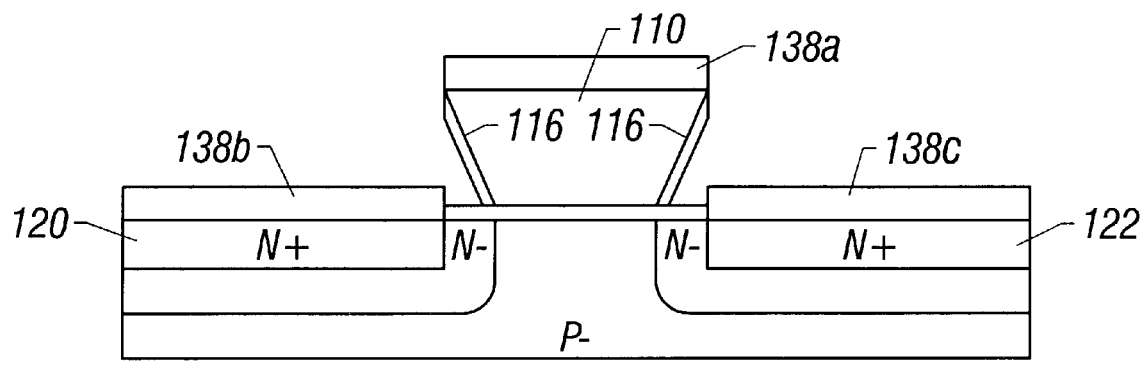

In FIG. 1I, a rapid thermal anneal on the order of 700° C. for 30 seconds is applied in a nitrogen ambient to convert titanium segments 136A, 136B and 136C into titanium silicide contacts 138A, 138B and 138C, respectively. Thereafter, any unreacted titanium (including titanium nitride) is stripped, and a subsequent anneal at 750 to 800° C. for 30 seconds is applied to produce a lower resistivity silicide. Titanium silicide contacts 138A, 138B and 138C have a thickness in the range of 200 to 600 angstroms and are separated from one another. Moreover, titanium silicide contacts 138B and 138C, like titanium segments 136B and 136C, are spaced from sidewalls 116 due to the retrograde slope of sidewalls 116. As a result, titanium silicide contacts 138A, 138B and 138C provide densely-packed, unbridged, low-resistance contacts for gate 110, heavily doped source region 120, and heavily doped drain region 122, respectively.

FIGS. 2A–2J show cross-sectional views of successive process steps for forming an IGFET with source and drain contacts in close proximity to a gate with sloped sidewalls in accordance with a second embodiment of the invention. It may be desirable to introduce the source/drain doping into the substrate by way of solid phase diffusion instead of ion implantation. An advantage of diffusion is that the peak dopant concentration in the substrate can occur in close proximity to the top surface of the substrate, thereby providing shallow channel junctions even after a high-temperature anneal. Furthermore, with ion implantation, channeling may occur when the ion beam which implants the dopants is closely aligned with the crystal lattice of the silicon. When channeling occurs, the dopants are initially implanted deep beneath the top surface of the substrate, but then as implantation continues the substrate surface becomes amorphic and less channeling occurs. Unfortunately, the depth of the channeled dopants is difficult to control. Channeling can be avoided by tilting the substrate (typically, at an angle of 7°) with respect to the ion beam. However, implanting off-axis can cause asymmetric doping of the source and drain regions.

The primary difference between the first and second embodiments is that in the first embodiment, a dopant is implanted into the substrate to provide doping for the source and drain, whereas in the second embodiment, elevated source and drain regions are deposited on the substrate, a dopant is implanted into the elevated source and drain regions, and then a thermal cycle is applied to diffuse the dopant from the elevated source and drain regions into underlying source and drain regions in the substrate. Unless otherwise noted, the elements for the second embodiment (substrate 202, gate oxide 204, etc.) are similar to elements of the first embodiment (substrate 102, gate oxide 104, etc.), and the description of related elements and process steps need not be repeated.

Figure 2A:
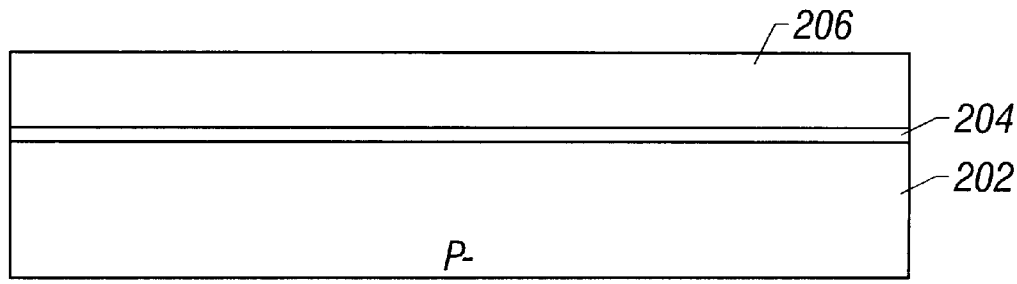
FIGS. 2A–2J show cross-sectional views of successive process steps for forming an IGFET with source and drain contacts in close proximity to a gate with sloped sidewalls in accordance with a second embodiment of the invention.

In FIG. 2A, gate oxide 204 is grown on substrate 202, and polysilicon 206 is deposited on gate oxide 204.

Figure 2B:
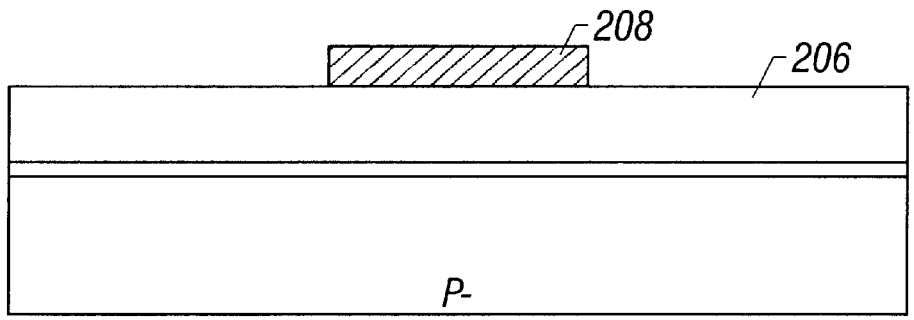

In FIG. 2B, photoresist 208 is deposited on polysilicon 206 and patterned to selectively expose polysilicon 206.

Figure 2C:
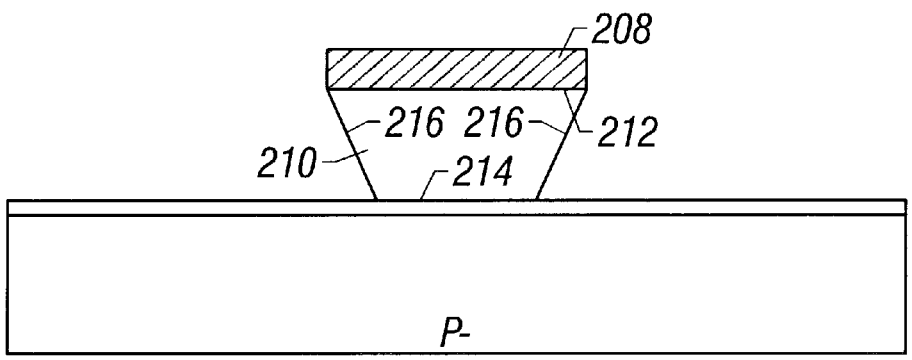

In FIG. 2C, a dry etch is applied that removes all polysilicon 206 outside photoresist 208 and portions of polysilicon 206 beneath photoresist 208. The remaining polysilicon 206 forms lower gate level 210 that includes top surface 212, bottom surface 214 and opposing sidewalls 216 with a retrograde slope.

Figure 2D:
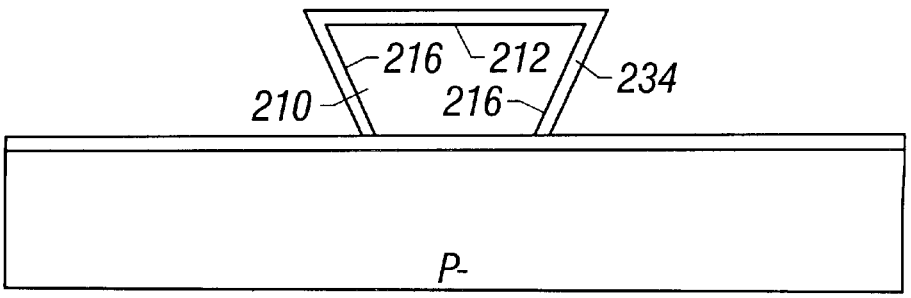

In FIG. 2D, photoresist 208 is stripped, and liner oxide 234 is grown on top surface 212 and sidewalls 216 of lower gate level 210.

Figure 2E:
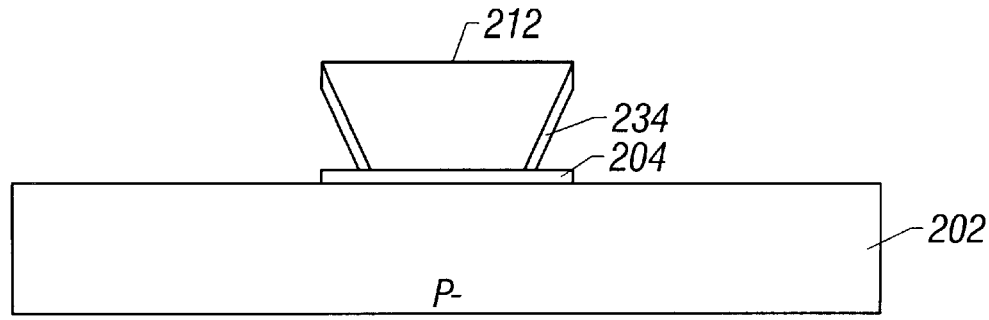

In FIG. 2E, an anisotropic reactive ion etch is applied that removes liner oxide 234 from top surface 212 and gate oxide 204 from the regions of substrate 202 that extend beyond top surface 212.

Figure 2F:
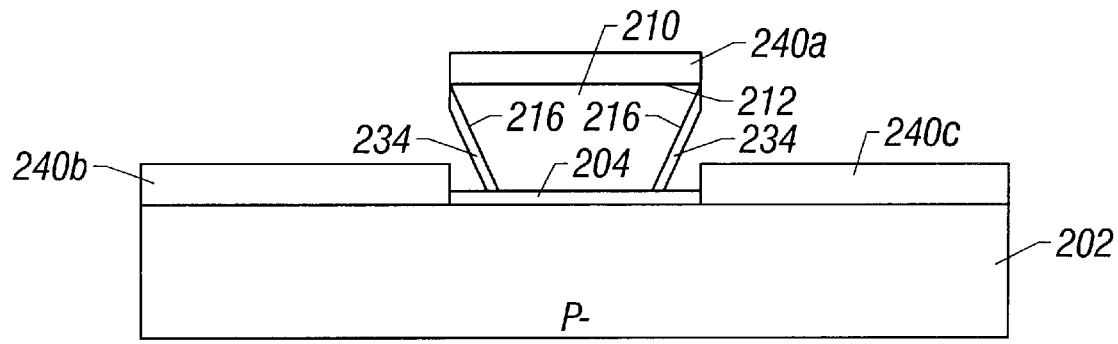

In FIG. 2F, epitaxial silicon 240 is selectively deposited on the exposed silicon (including polysilicon) surfaces. There are basically two types of selective epitaxial deposition processes. In "Type 1" processes, epitaxial growth occurs only on the exposed silicon and no growth occurs on the exposed oxide. In "Type 2" processes, epitaxial growth occurs on both the exposed silicon and the exposed oxide. Epitaxial silicon 240 is deposited using a Type 1 process. $SiCl_4$ and $SiHCl_3$ provide suitable silicon sources. $SiH_2Cl_2$ and $SiH_4$ also provide suitable silicon sources if HCl or $Cl_2$ is added to the reaction. Furthermore, bromine based silicon compounds such as $SiHBr_3$ and $SiBr_4$ have shown improved selectivity over their chlorinated counterparts. Factors that enhance the selective nature of a Type 1 process include reduced pressure, increased temperature, and decreased mole fraction of the silicon source in the gas stream. Selective deposition of epitaxial silicon is well-known in the art. See, for instance, SILICON PROCESSING FOR THE VLSI ERA, Volume 1: Process Technology, by S. Wolf and R. N. Tauber, published by Lattice Press, Sunset Beach, Calif., pp. 155–156 (1986), which is incorporated by reference.

Epitaxial silicon 240 has a thickness of 1000 angstroms and forms upper gate level 240A on top surface 212 of lower gate level 210, elevated source region 240B on substrate 202, and elevated drain region 240C on substrate 202. Upper gate level 240A and elevated source and drain regions 240B and 240C have essentially identical compositions, essentially identical thicknesses and are formed simultaneously. Furthermore, the thickness of lower gate level 210 (2000 angstroms) is substantially greater than the thicknesses (1000 angstroms) of elevated source and drain regions 240B and 240C. As a result, the left sidewall of upper gate level 240A is substantially aligned with and above and separated from the right sidewall of elevated source region 240B, and likewise, the right sidewall of upper gate level 240A is substantially aligned with and above and separated from the left sidewall of elevated drain region 240C. As is seen, elevated source and drain regions 240B and 240C are spaced from sidewalls 216 due to the retrograde slope of sidewalls 216. In addition, liner oxide 234 on sidewalls 216 assures that any portions of elevated source and drain regions 240B and 240C that might extend beneath top surface 212 remain electrically isolated from lower gate level 210. Furthermore, a multilevel gate that consists of lower gate level 210 and upper gate level 240A is spaced from and electrically isolated from elevated source and drain regions 240B and 240C.

Upper gate level 240A is separated from elevated source and drain regions 240B and 240C due to a lack of step coverage of epitaxial silicon 240, using lower gate level 210 and gate oxide 204 as the step above substrate 202. That is, upper gate level 240A, elevated source region 240B and elevated drain region 240C are separated segments formed simultaneously as a blanket layer of epitaxial silicon 240 is deposited on lower gate level 210 and substrate 202. Advantageously, upper gate level 240A is separated from elevated source and drain regions 240B and 240C without the need for spacers extending beyond top surface 212, and without the need for subsequent etching or polishing steps.

Figure 2G:
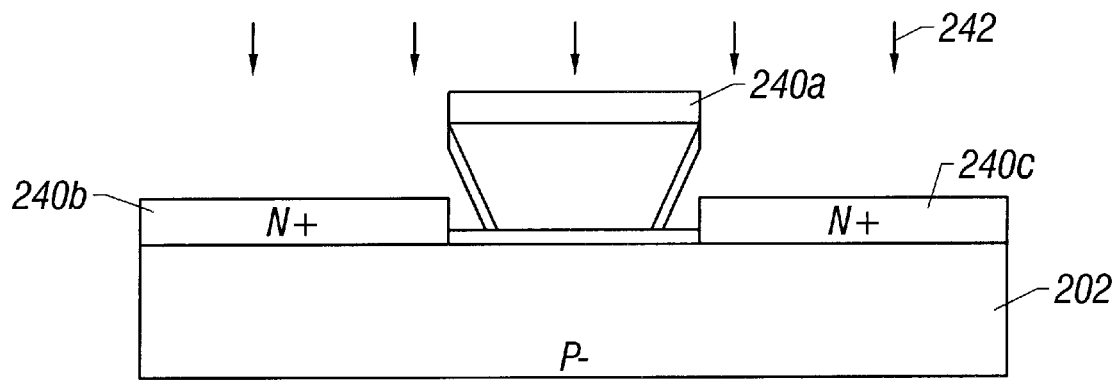

In FIG. 2G, the structure is subjected to ion implantation of arsenic and phosphorus, as indicated by arrows 242, at a dosage in the range of $1\times10^{15}$ to $5\times10^{15}$ atoms/cm$^2$, and an energy in the range of 30 to 60 kiloelectron-volts for arsenic and 10 to 40 kiloelectron-volts for phosphorus. The arsenic and phosphorus are implanted into epitaxial silicon 240; however, epitaxial silicon 240 blocks essentially all of the arsenic and phosphorus impinging thereon from being implanted into the underlying materials. That is, upper gate level 240A provides an implant mask for lower gate level 210, and elevated source and drain regions 240B and 240C provide implant masks for the underlying portions of substrate 202. As a result, elevated source and drain regions 240B and 240C are doped N+ with a dopant concentration in the range of $1\times10^{18}$ to $1\times10^{20}$ atoms/cm$^3$, and substrate 202 remains essentially devoid of N-type doping.

Figure 2H:
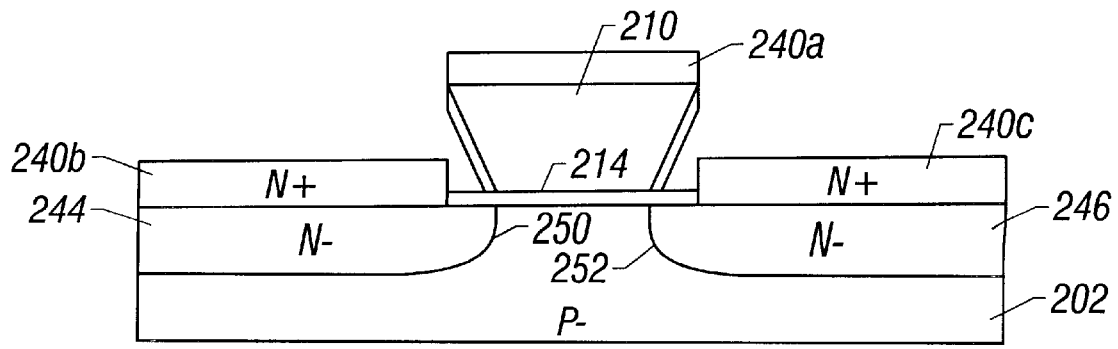

In FIG. 2H, the device is annealed to remove crystalline damage and drive-in and activate the implanted dopants using a rapid thermal anneal on the order of 950 to 1050° C. for 10 to 60 seconds. The phosphorus diffuses far more rapidly than the arsenic. As a result, phosphorus in upper gate level 240A diffuses into lower gate level 210, and phosphorus in elevated source and drain regions 240B and 240C diffuses into underlying source and drain regions 244 and 246 in substrate 202. Since the phosphorus diffuses both laterally and vertically, underlying source region 244 forms channel junction 250 that is substantially aligned with the left edge of bottom surface 214, and underlying drain region 246 forms channel junction 252 that is substantially aligned with the right edge of bottom surface 214. Underlying source and drain regions 244 and 246 are doped N− with a dopant concentration in the range of $1\times10^{17}$ to $1\times10^{18}$ atoms/cm$^3$. Channel junctions 250 and 252 define a channel between a source, that consists of elevated source region 240B and underlying source region 244, and a drain, that consists of elevated drain region 240C and underlying drain region 246, for an N-channel MOSFET controlled by a multilevel gate that consists of lower gate level 210 and upper gate level 240A.

Further details regarding elevated source and drain regions are set forth in U.S. application serial no. 08/837,539 filed concurrently herewith, pending, entitled "IGFET with Elevated Source/Drain Regions in Close Proximity to Gate with Sloped Sidewalls" by Michael et al., which is incorporated by reference.

Figure 2I:
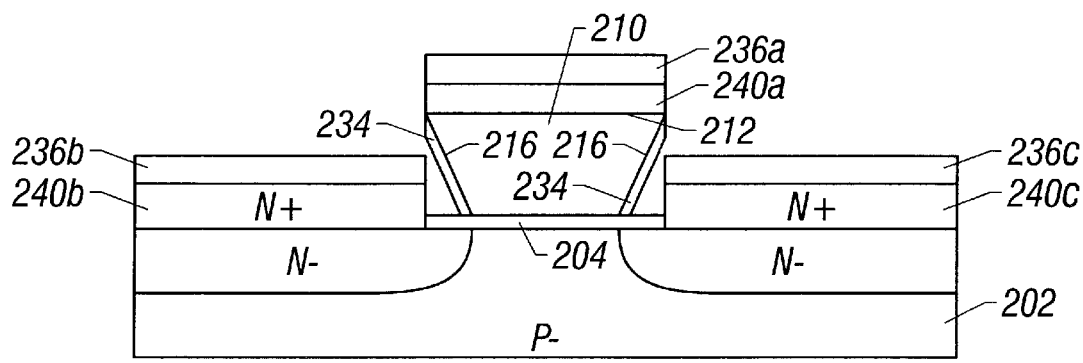

In FIG. 2I, a blanket layer of titanium 236 with a thickness in the range of 100 to 350 angstroms is deposited over substrate 202 by LPCVD at an angle normal to substrate 202. Titanium 236 forms titanium segment 236A on upper gate level 240A, titanium segment 236B on elevated source region 240B, and titanium segment 236C on elevated drain region 236C. Titanium segments 236A, 236B and 236C have essentially identical compositions, essentially identical thicknesses and are formed simultaneously. Furthermore, the thickness of lower gate level 210 (2000 angstroms) is substantially greater than the combined thickness (1100 to 1350 angstroms) of titanium segment 236B and elevated source region 240B, and the combined thickness (1100 to 1350 angstroms) of titanium segment 236C and elevated drain region 240C. As a result, the left sidewalls of titanium segment 236A and upper gate level 240A are substantially aligned with and above and separated from the right sidewall of titanium segment 236B, and likewise, the right sidewalls of titanium segment 236A and upper gate level 240A are substantially aligned with and above and separated from the left sidewall of titanium segment 236C. As is seen, titanium segments 236B and 236C are spaced from sidewalls 216 due to the retrograde slope of sidewalls 216. In addition, liner oxide 234 on sidewalls 216 assures that any portions of titanium segments 236B and 236C that might extend beneath top surface 212 remain electrically isolated from lower gate level 210.

Titanium segment 236A is separated from titanium segments 236B and 236C due to a lack of step coverage of titanium 236, using upper gate level 240A and lower gate level 210 and gate oxide 204 as the step above elevated source and drain regions 240B and 240C. That is, titanium segments 236A, 236B and 236C are separated segments formed simultaneously as a blanket layer of titanium 236 is deposited on upper gate level 240A and elevated source and drain regions 240B and 240C. Advantageously, titanium segments 236A, 236B and 236C are separated from one another without the need for spacers extending beyond top surface 212, and without the need for subsequent etching or polishing steps.

Figure 2J:
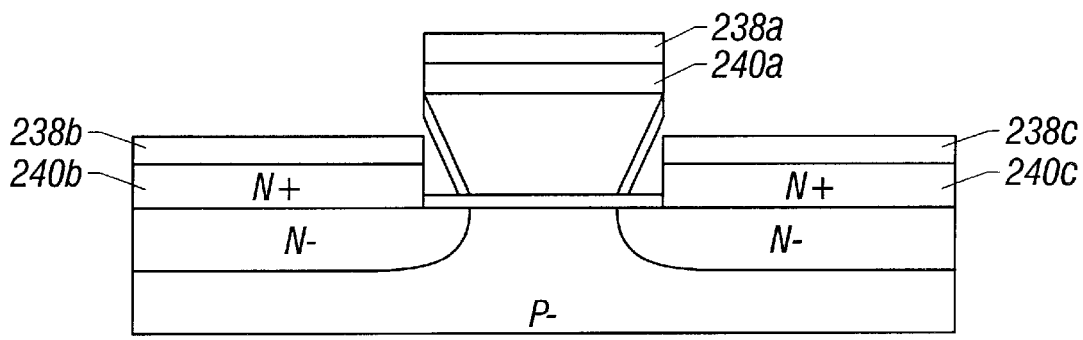

In FIG. 2J, a rapid thermal anneal on the order of 700° C. for 30 seconds is applied in a nitrogen ambient to convert titanium segments 236A, 236B and 236C into titanium silicide contacts 238A, 238B and 238C, respectively. Thereafter, any unreacted titanium (including titanium nitride) is stripped, and a subsequent anneal at 750 to 800° C. for 30 seconds is applied to produce a lower resistivity silicide. Titanium silicide contacts 238A, 238B and 238C have a thickness in the range of 200 to 600 angstroms and provide densely-packed, unbridged, low-resistance contacts for upper gate level 240A, elevated source region 240B, and elevated drain region 240C, respectively.

Further processing steps in the fabrication of IGFETs typically include forming a thick oxide layer over the active regions, forming contact windows in the oxide layer to expose the silicide contacts, forming appropriate interconnect metallization in the contact windows, and forming a passivation layer. In addition, subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps readily apparent to those skilled in the art.

At completion of the process, it is preferred that the lateral locations of the channel junctions be precisely controlled. However, to the extent that these locations are not (or can not be) precisely controlled, it is far preferable to have a slight overlap between the junctions and the bottom surface of the gate as opposed to a lateral displacement or gap. While a slight overlap will lead to capacitive effects (known as "Miller capacitance") that tend to reduce switching speeds, a lateral displacement or gap may prevent the formation of a conductive channel between the source and drain during device operation or a non-controlled threshold voltage. The overlap is a function of numerous factors, including dopant concentration, the diffusion rate of the dopant, and the difference in length between the top and bottom surfaces of the gate. For instance, boron diffuses far more rapidly than phosphorus, which in turn diffuses far more rapidly than arsenic.

In the event the elevated source and drain regions are formed, the thick oxide layer formed over the active region (after the silicide contacts are formed) need not fill the regions between the top and bottom surfaces of the lower gate level and between the sidewalls of the lower gate level and elevated source and drain regions. In fact, leaving air gaps in these regions provides a lower dielectric constant than filling the regions with the oxide layer, thereby reducing capacitive coupling to the gate. Moreover, the epitaxial silicon layer that forms the upper gate level and elevated source and drain regions can be deposited by various techniques, including low pressure chemical vapor deposition in a direction normal to the top surface of the substrate. If desired, the dopant can be implanted both into the elevated source and drain regions and through the elevated source and drain regions into the underlying source and drain regions, although it is preferred that most or all of the source/drain doping for the underlying source and drain regions be diffused from the elevated source and drain regions.

The present invention includes numerous variations to the embodiments described above. For instance, the gate can be various conductors, and the gate insulator and liner insulator (on the sloped sidewalls of the gate) can be various dielectrics. The liner insulator is optional, and portions of the gate insulator beneath the sloped sidewalls of the gate can be removed. A contact material such as polysilicon or various conductive metals can be deposited on the gate, source and drain to form the gate, source and drain contacts. Alternatively, various refractory metals can be deposited on the gate, source and drain and then subsequently converted into a silicide to form the gate, source and drain contacts. Moreover, titanium can be deposited on native oxide on the gate, source and drain, since forming titanium silicide contacts reduces or eliminates the native oxide. Therefore, the titanium need not be deposited directly on the gate, source and drain. As another variation, stacked contacts may be formed in a process that includes depositing several successive layers of contact materials with a lack of step coverage and with separation from the sidewalls of the gate due to the retrograde slope of the sidewalls of the gate. For instance, stacked contacts may include aluminum deposited on titanium silicide so that the aluminum is separated from the source and drain to prevent junction spiking. The conductivity types can be reversed. Suitable N-type dopants include arsenic and phosphorus; suitable P-type dopants include boron $B_{10}$, boron $BF_{11}$, and $BF_X$ species such as $BF_2$. In the event P-type dopants are used, preferably suitable parameters are chosen to prevent boron penetration through the gate insulator into the channel region.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET, comprising the steps of:

forming a gate over a semiconductor substrate, wherein the gate includes a top surface, a bottom surface and opposing sidewalls, and the top surface has a substantially greater length than the bottom surface;

forming a source and a drain that extend into the substrate by implanting first and second dopant ions therein, wherein the top surface forms a mask preventing the source and drain regions form extending to a position proximate to the bottom surface;

annealing the substrate thereby forming a lightly doped source region extending from the source to a position proximate the bottom surface and forming a lightly doped drain region extending from the drain to a position proximate the bottom surface;

depositing a contact material over the gate, source and drain; and forming a gate contact on the gate, a source contact on the source, and a drain contact on the drain, wherein the gate contact is separated from the source and drain contacts due to a lack of step coverage in the contact material.

2. The method of claim 1, wherein the source and drain are entirely within the substrate, and the source and drain contacts are adjacent to the substrate.

3. The method of claim 1, wherein the source and drain include elevated source and drain regions that extend above the substrate and underlying source and drain regions in the substrate, and the source and drain contacts are adjacent to the elevated source and drain regions and spaced from the substrate.

4. The method of claim 1, wherein the sidewalls of the gate are covered with a liner insulator during deposition of the contact material.

5. The method of claim 1, wherein depositing the contact material forms the gate, source and drain contacts.

6. The method of claim 5, wherein the contact material is a refractory metal, and forming the gate, source and drain contacts includes converting the refractory metal into a silicide.

7. The method of claim 1, wherein sidewalls of the source and drain contacts are substantially aligned with edges where the sidewalls of the gate intersect the top surface of the gate.

8. The method of claim 1, wherein the gate is separated from the source and drain contacts due to a retrograde slope of the sidewalls of the gate.

9. The method of claim 1, wherein the first and second dopant ions are arsenic and phosphorous.

10. A method of forming an IGFET, comprising the steps of:

providing a semiconductor substrate;

forming a gate insulator on the substrate;

forming a gate on the gate insulator, wherein the gate includes a top surface, a bottom surface and opposing sidewalls between the top and bottom surfaces, the top surface has a substantially greater length than the bottom surface, and portions of the sidewalls intersect the bottom surface and slope outward as a height of the gate increases;

forming a source and a drain that extend into the substrate by implanting first and second dopant ions in the substrate;

annealing the substrate forming lightly doped source/drain region under outward sloping sidewalls;

depositing a contact material over the gate, source and drain; and forming a gate contact on the gate, a source contact on the source, and a drain contact on the drain, wherein the gate contact is separated from the source and drain contacts due to a lack of step coverage in the contact material, and the gate is separated from the source and drain contacts due to the retrograde slope of the sidewalls.

11. The method of claim 10, wherein the source and drain are entirely within the substrate, and the source and drain contacts are adjacent to the substrate.

12. The method of claim 10, wherein the source and drain include elevated source and drain regions above the substrate and on underlying source and drain regions in the substrate, and the source and drain contacts are adjacent to the elevated source and drain regions and spaced from the substrate.

13. The method of claim 12, wherein forming the gate and the source and drain includes depositing an epitaxial silicon layer over the substrate to form an upper gate level of the gate and the elevated source and drain regions, such that the upper gate level is separated from the elevated source and drain regions due to a lack of step coverage in the epitaxial silicon layer.

14. The method of claim 10, wherein depositing the contact material forms the gate, source and drain contacts.

15. The method of claim 10, wherein the contact material is a refractory metal, and forming the gate, source and drain contacts includes converting the refractory metal into a silicide.

16. The method of claim 10, wherein the sidewalls are exposed during deposition of the contact material.

17. The method of claim 10, wherein the sidewalls are covered with a liner insulator during deposition of the contact material.

18. The method of claim 10, wherein the first and second dopants are arsenic and phosphorous ions.

19. A method of forming an IGFET, comprising the steps of:

providing a semiconductor substrate of first conductivity type;

forming a gate oxide on the substrate;

forming a polysilicon layer on the gate oxide;

forming a masking layer over the polysilicon layer;

applying a dry etch that removes portions of the polysilicon layer beneath openings in the masking layer and portions of the polysilicon layer beneath the masking layer, wherein an unetched portion of the polysilicon layer forms a gate that includes a top surface, a bottom surface and opposing sidewalls, the top surface has a length that is substantially greater than that of the bottom surface, and the sidewalls of the gate have a retrograde slope that extends outward as a height of the gate increases;

forming a source and a drain entirely within the substrate, including implanting first and second dopants of a second conductivity type into the substrate using the gate as an implant mask for an underlying region of the substrate;

annealing the substrate to form a lightly doped regions under the retrograde slope of the gate;

depositing a refractory metal layer over the gate and regions of the source and drain to simultaneously form refractory metal segments over the gate, source and drain, wherein sidewalls of the refractory metal segments over the source and drain are substantially aligned with sidewalls of the refractory metal segment over the gate, the refractory metal segments over the source and drain are spaced from the gate due to the retrograde slope of the sidewalls of the gate, and the refractory metal segments over the source and drain are separated from the refractory metal segment over the gate due to a lack of step coverage in the refractory metal layer; and applying a thermal cycle to convert the refractory metal segments into silicide contacts on the gate, source and drain.

20. A method of forming an IGFET, comprising the steps of:

providing a semiconductor substrate of first conductivity type;

forming a gate oxide on the substrate;

forming a polysilicon layer on the gate oxide;

forming a masking layer over the polysilicon layer;

applying a dry etch that removes portions of the polysilicon layer beneath openings in the masking layer and portions of the polysilicon layer beneath the masking layer, wherein an unetched portion of the polysilicon layer forms a lower gate level that includes a top surface, a bottom surface and opposing sidewalls, the top surface has a length that is substantially greater than that of the bottom surface, and the sidewalls of the lower gate level have a retrograde slope that extends outward as a height of the lower gate level increases;

removing regions of the gate insulator outside the lower gate level;

depositing an epitaxial silicon layer on the lower gate level and on underlying source and drain regions of the substrate to simultaneously form an upper gate level on the lower gate level, an elevated source region on the underlying source region, and an elevated drain region on the underlying drain region, wherein the lower gate level is at least twice as thick as the epitaxial silicon layer, sidewalls of the elevated source and drain regions are beneath and substantially aligned with opposing sidewalls of the upper gate level, the elevated source and drain regions are spaced from the lower gate level due to the retrograde slope of the sidewalls of the lower gate level, and the elevated source and drain regions are separated from the upper gate level due to a lack of step coverage in the epitaxial silicon layer;

implanting a first and a second dopant of second conductivity type into the elevated source and drain regions, thereby doping the elevated source and drain regions as heavily doped source and drain regions;

diffusing dopant from the elevated source and drain regions into the underlying source and drain regions, thereby doping the underlying source and drain regions as lightly doped source and drain regions and converting the underlying source and drain regions from first conductivity type into second conductivity type;

depositing a refractory metal layer over the gate and the elevated source and drain regions to simultaneously form refractory metal segments over the gate, source and drain, wherein sidewalls of the refractory metal segments over the source and drain are substantially aligned with sidewalls of the refractory metal segment over the gate, the refractory metal segments over the source and drain are spaced from the gate due to the retrograde slope of the sidewalls of the lower gate level, and the refractory metal segments over the source and drain are separated from the refractory metal segment over the gate due to a lack of step coverage in the refractory metal layer; and applying a thermal cycle to convert the refractory metal segments into suicide contacts on the gate, source and drain.

* * * * *